United States Patent [19]
Yamazaki

[11] Patent Number: 6,160,433
[45] Date of Patent: Dec. 12, 2000

[54] METHOD FOR GENERATING CLOCK AND CLOCK GENERATING CIRCUIT

[75] Inventor: Masato Yamazaki, Tokyo, Japan

[73] Assignee: OKI Electric Industry Co., Ltd., Tokyo, Japan

[21] Appl. No.: 09/182,813

[22] Filed: Oct. 30, 1998

[30] Foreign Application Priority Data

Feb. 9, 1998 [JP] Japan ................................. 10-027200

[51] Int. Cl.⁷ ...................................................... H03L 7/00
[52] U.S. Cl. .......................... 327/159; 327/299; 327/141; 327/294
[58] Field of Search ................................. 327/39, 40, 41, 327/42, 43, 146, 150, 156, 159, 141, 144, 145, 291, 293, 294, 299

[56] References Cited

U.S. PATENT DOCUMENTS

| | | | |
|---|---|---|---|
| 4,837,781 | 6/1989 | Hickling | 375/81 |
| 5,065,115 | 11/1991 | Pletz-Kirsh et al. | 331/14 |
| 5,781,044 | 7/1998 | Riley et al. | 327/105 |

*Primary Examiner*—Tuan T. Lam
*Assistant Examiner*—Linh Nguyen
*Attorney, Agent, or Firm*—Rabin & Champagne, P.C.

[57] ABSTRACT

A first clock and a second clock are provided. The first and second clocks operate at first and second frequencies, respectively. The phase difference between the first clock and the second clock is accumulated to generate a control signal. In response to the control signal, the phase of the second clock is controlled so as to synchronize with the first clock. Preferably, the phase of the second clock is shifted from the normal timing, when the accumulated value reaches a cycle of the first clock.

11 Claims, 8 Drawing Sheets

METHOD FOR GENERATING CLOCK AND CLOCK GENERATING CIRCUIT

CROSS REFERENCE TO RELATED APPLICATION

This application claims the priority of Application No. H10-27200, filed Feb. 9, 1998 in Japan, the subject matter of which is incorporated herein by reference.

TECHNICAL FIELD OF THE INVENTION

The present invention relates to a method for generating a clock and a clock generating circuit. More particularly, the invention relates to a phase-locked type of circuit that keeps two signals, whose phase relative to each other, constant.

BACKGROUND OF THE INVENTION

Conventional technology is described in pages 5–7, PLL (Phase-Locked-Loop) Application Circuit, Sep. 10, 1979, Takeshi Yanagisama, from Sogo-Electric Publication Co. A phase-locked loop is a circuit for synchronizing a variable local oscillator with the phase of a transmitted signal. It is widely used in space communication for coherent carrier tracking, and threshold extension, but synchronization and symbol synchronization.

The conventional clock generating circuit includes a phase comparator to which a base clock (input clock) is supplied, a loop filter and a voltage-controlled oscillator. In the clock generating circuit, the phase comparator compares the phases of the base clock and an output clock to generate a signal corresponding to the phase difference between them. The loop filter removes high frequency component from the signal to generate a low frequency signal. The voltage-controlled oscillator is controlled with the low frequency signal so that the phase difference between the output clock and the base clock approximates zero.

According to the above-described conventional technology, however, it is difficult to generate an output clock having a frequency that is much different from the base clock (input clock). In other words, for generating such an output clock with the conventional circuit, it is required to adjust or control many components precisely. On the other hand, if digital circuits are used, it is easy to generate such an output clock, however, the circuitry becomes complicated in structure. Consequently, it is difficult to put the conventional circuit in practical use for generating such an output clock having a frequency that is much different from the base clock (input clock).

OBJECTS OF THE INVENTION

Accordingly, an object of the invention is to provide without complicated steps a method for generating a clock operating at a variety of frequencies.

Another object of the invention is to provide with simple circuitry a clock generating circuit that can generate clocks operating at a variety of frequencies.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, in a method for generating a clock, a first clock operating at a first Frequency, and a second clock operating at a second frequency that is different from the first Frequency, are provided. Then, the phase difference between the first clock and the second clock is accumulated to generate a control signal. In response to the control signal, the phase of the second clock is controlled so as to synchronize with the first clock. Preferably, the phase of the second clock is shifted from the normal timing when the accumulated value reaches a cycle of the first clock.

According to a second aspect of the invention, a clock generating circuit includes an accumulating circuit that accumulates the phase difference between the first clock and the second clock to generate a control signal. The clock generating circuit also includes a control circuit that controls in response to the controls, signal the phase of the second clock so as to synchronize with the first clock. Preferably, the phase of the second clock is shifted from the normal timing when the accumulated value reaches a cycle of the first clock.

DETAILED DISCLOSURE OF THE INVENTION

Figure 1:
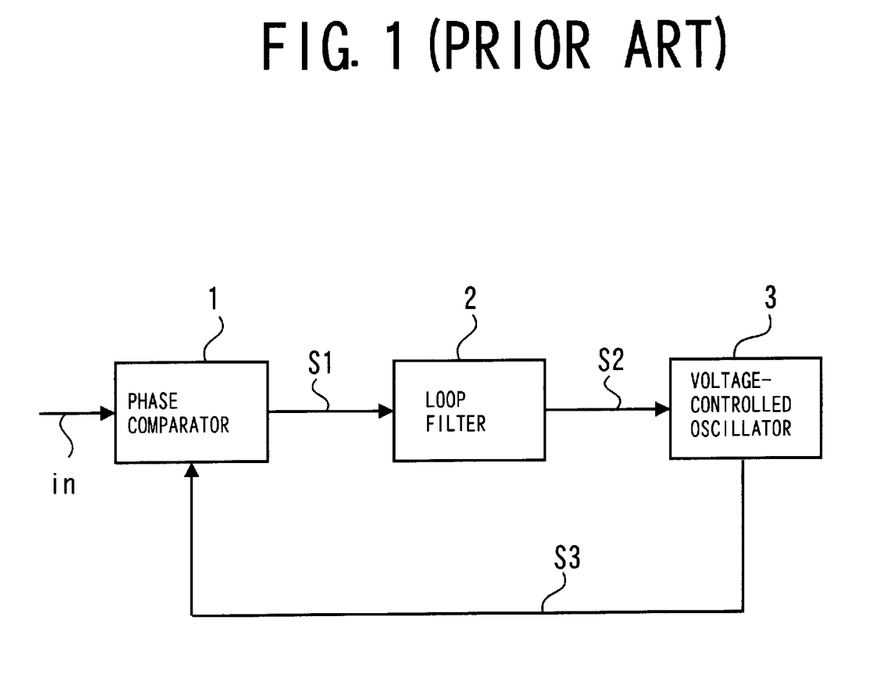
FIG. 1 is a circuit diagram showing a conventional clock generating circuit.

For better understanding of the invention, conventional technology will be first described. FIG. 1 shows a conventional clock generating circuit described in pages 5–7, PLL (Phase-Locked-Loop) Application Circuit, Sep. 10, 1979, by Takeshi Yanagisama, from Sogo-Electric Publication Co. The clock generating circuit includes a phase comparator 1, to which a base clock "in" is supplied, a loop filter 2 and a voltage-controlled oscillator 3. The loop filter 2 is connected at an input terminal to an output terminal of the phase comparator 1, and at an output terminal to an input terminal of the voltage-controlled oscillator 3.

The phase comparator 1 compares the phases of the base clock "in" and an output clock S3 to generate a signal S1, corresponding to the phase difference between the clocks "in" and S3. The loop filter 2 removes high frequency components of the signal S1 to generate a low frequency signal S2. The voltage-controlled oscillator 3 is controlled with the signal S2 so that the phase difference between the output clock S3 and the base clock "in" approximates zero.

According to the above-described conventional technology, however, it is difficult to generate an output clock having a frequency that is much different from the base clock (input clock). In other words, for generating such an output clock with the conventional circuit, it is required to adjust or control many components precisely. On the other hand, if digital circuits are used, it is easy to generate such an output clock, however, the circuitry becomes complicated in structure. Consequently, it is difficult to put the conventional circuit in practical use for generating such an output clock having a frequency that is much different from the base clock (input clock).

Figure 2:
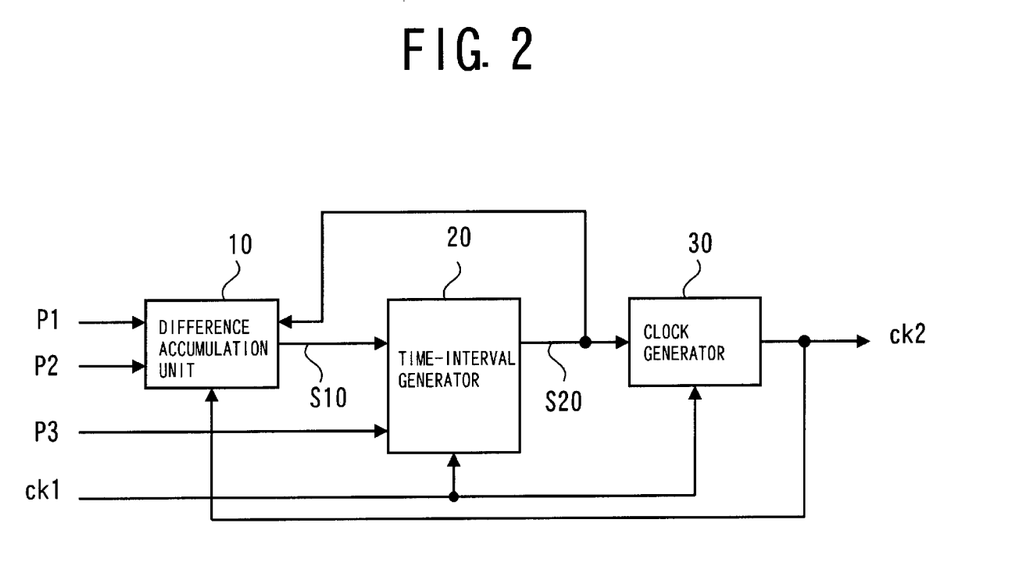
FIG. 2 is a circuit diagram showing a clock generating circuit according to a first preferred embodiment of the present invention.

FIG. 2 shows a clock generating circuit, according to a first preferred embodiment of the invention. The clock generating circuit includes a difference accumulation unit 10, a time-interval generator 20 and a clock generator 30. The difference accumulation unit 10 is provided with first and second parameters P1 and P2 and with a second clock (output clock) ck2. The first and second parameters P1 and P2 are used for defining the frequency of the second clock ck2. The difference accumulation unit 10 is connected at an output terminal to the time-interval generator 20. The difference accumulation unit 10 is also supplied with a timing signal S20 from the time-interval generator 20 and generates a time-interval extension signal S10.

The time-interval generator 20 is supplied with a third parameter P3 and a first clock (input clock) ck1. The third parameter P3 is used for defining the frequency of the second clock ck2. The time-interval generator 20 is connected at an output terminal to the difference accumulation unit 10 and the clock generator 30. The time-interval generator 20 generates the timing signal S20 in response to the time-interval extension signal S10, the third parameter P3 and the first clock ck1. The clock generator 30 generates the second clock ck2 in response to the timing signal S20 and the first clock ck1. The clock generator 30 is connected at an output terminal to the difference accumulation unit 10 and to a predetermined device (not shown), which operates in response to the second clock ck2.

Figure 3:
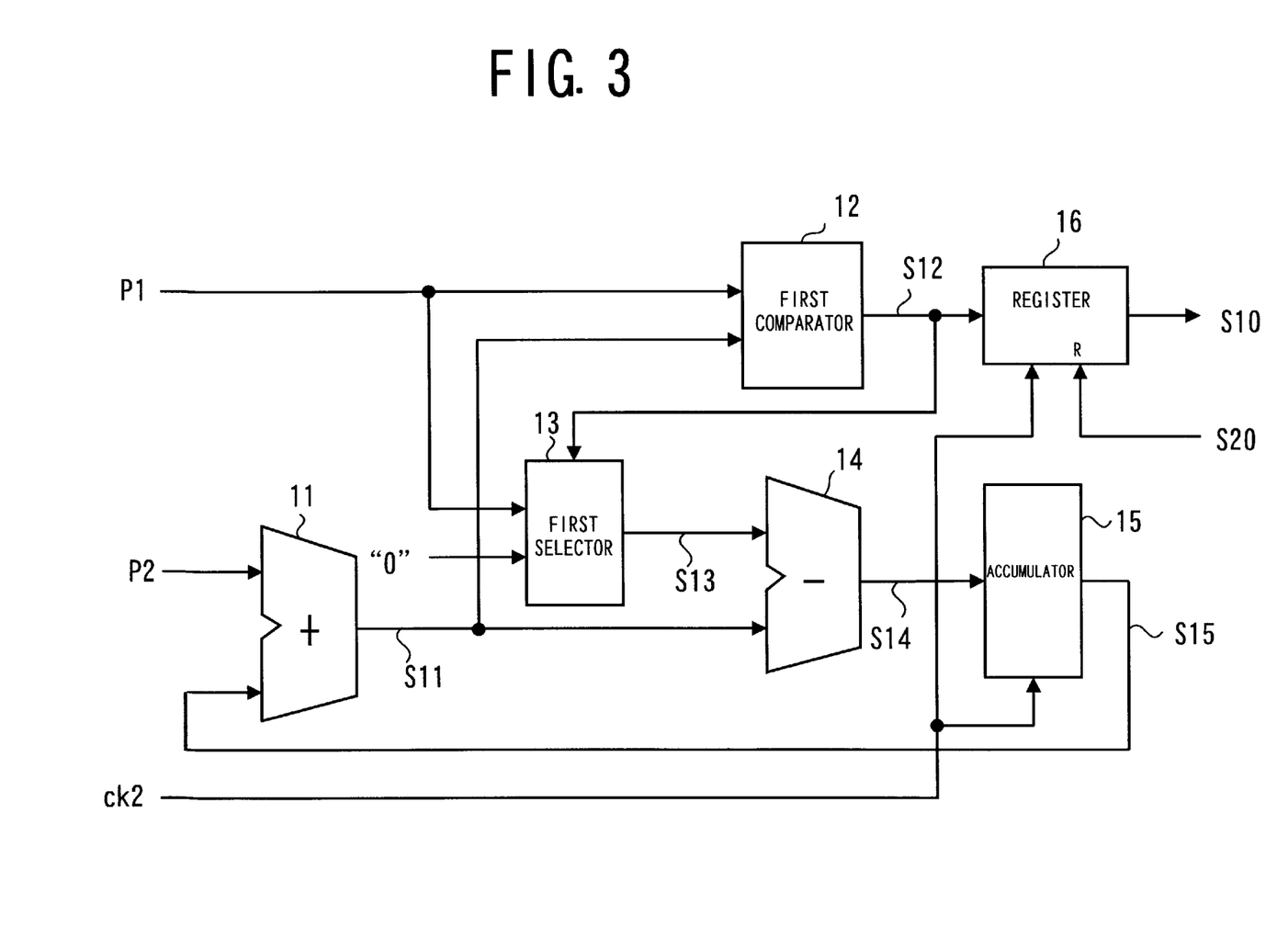
FIG. 3 is a circuit diagram showing an accumulation unit used in the clock generating circuit shown in FIG. 2.

FIG. 3 shows the structure of the difference accumulation unit 10, shown in FIG. 2. The difference accumulation unit 10 includes an adder 11, a first comparator 12, a first selector 13, a subtractor 14, an accumulator 15 and a register 16. The adder 11 is supplied at input terminals with the second parameter P2 and an output signal S15 of the accumulator 15. The adder 11 is connected at an output terminal to input terminals of the first comparator 12 and the subtractor 14. The adder 11 combines the second parameter P2 and the signal S15 to generate a signal S11.

The first comparator 12 is supplied at input terminals with the first parameter P1 and the signal S11, supplied from the adder 11. The first comparator 12 is connected at an output terminal to the first selector 13 and the register 16. The first comparator 12 compares the signal S11, supplied from the adder 11, and the first parameter P1 to generate a signal S12. The signal S12 is in a non-active mode when the parameter P1 is larger than the signal S11, and is in an active mode otherwise.

The first selector 13 is supplied at input terminals with the first parameter P1 and a fixed value, such as "0". The first selector 13 is connected at an output terminal to the subtractor 14. The first selector 13 selects one of the input signals in response to the signal S12, supplied from the first comparator 12, to generate a signal S13. In more detail, the first selector 13 selects the fixed value when the signal S12 is in the non-active mode, and selects the first parameter P1 when the signal S12 is in the active mode.

The subtractor 14 is supplied at input terminals with the signals S11 and S13. The subtractor 14 is connected at an output terminal to the accumulator 15. The subtractor 14 subtracts the value indicated by the signal S13 from the value indicated by the signal S11 to generate a signal S14. In other words, the signal S14 becomes the signal S11, when the first selector 13 selects the fixed value of zero; and becomes the value generated by subtracting the first parameter P1 from the signal S11, when the first selector 13 selects the first parameter P1 as the output signal S13.

The accumulator 15 is supplied at an input terminal with the signal S14 outputted from the subtractor 14. The accumulator 15 is connected at an output terminal to the adder 11. The accumulator 15 accumulates the signal S14 in synchronization with the second clock ck2 to generate the signal (accumulated value) S15.

The register 16 is supplied at an input terminal with the signal S12 from the first comparator 12, at another terminal with the second clock ck2 and at a reset terminal with the timing signal S20. The register 16 is supplied with the signal S12 and temporarily store it in synchronization with the second clock ck2. The stored signal is supplied from the register 16 as the time-interval extension signal S10. The register 16 is reset in response to the timing signal S20.

Figure 4:
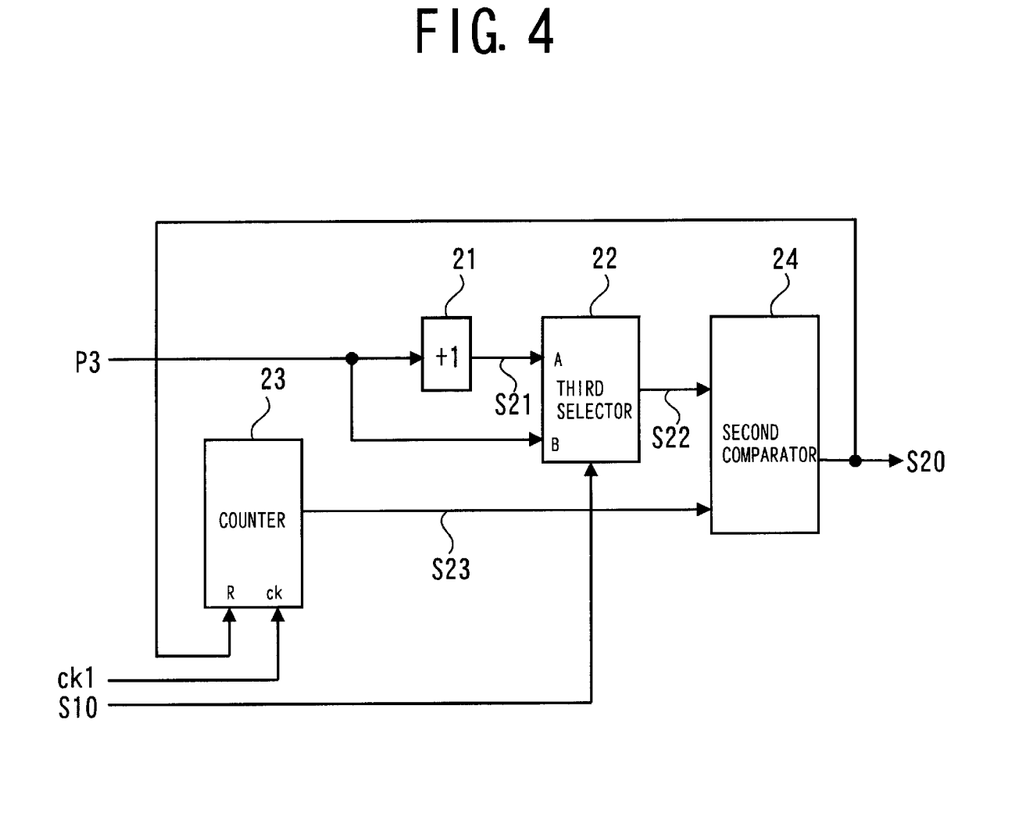
FIG. 4 is a circuit diagram showing a time-interval generator used in the clock generating circuit shown in FIG. 2.

FIG. 4 shows the time-interval generator 20 used in the clock generating circuit shown in FIG. 2. The time-interval generator 20 includes an incrementor 21, a third selector 22, a counter 23 and a second comparator 24. The incrementor 21 is supplied with the third parameter P3, and is connected at an output terminal to the selector 22. The incrementor 21 increments the third parameter P3 by one to generate a signal S21.

The third selector 22 is supplied at input terminals "A" and "B" with the signal S21, supplied from the incrementor 21, and with the third parameter P3, respectively. The third selector 22 is connected at an output terminal to the third comparator 24. In operation, the second selector 22 selects the signal S21, when the time-interval extension signal S10 is in the active mode; and selects the third parameter P3, when the time-interval extension signal S10 is in the non-active mode or the timing signal S20 is generated.

The counter 23 is supplied at a reset terminal and a clock terminal with the timing signal S20 and the first clock ck1, respectively. The counter 23 is connected at an output terminal to the second comparator 24. The counter 23 counts the first clock ck1 to generate a signal 23. In response to the timing signal S20, the counter 23 is reset.

The second comparator 24 is supplied at input terminals with the signal S22 from the third selector 22 and the signal S23 from the counter 23, and is connected at an output terminal to the reset terminal "R" of the counter 23. In operation, the second comparator 24 compares those two signals S22 and S23 and supplies the timing signal S20, when the signals S22 and S23 are identical to each other.

Figure 5:
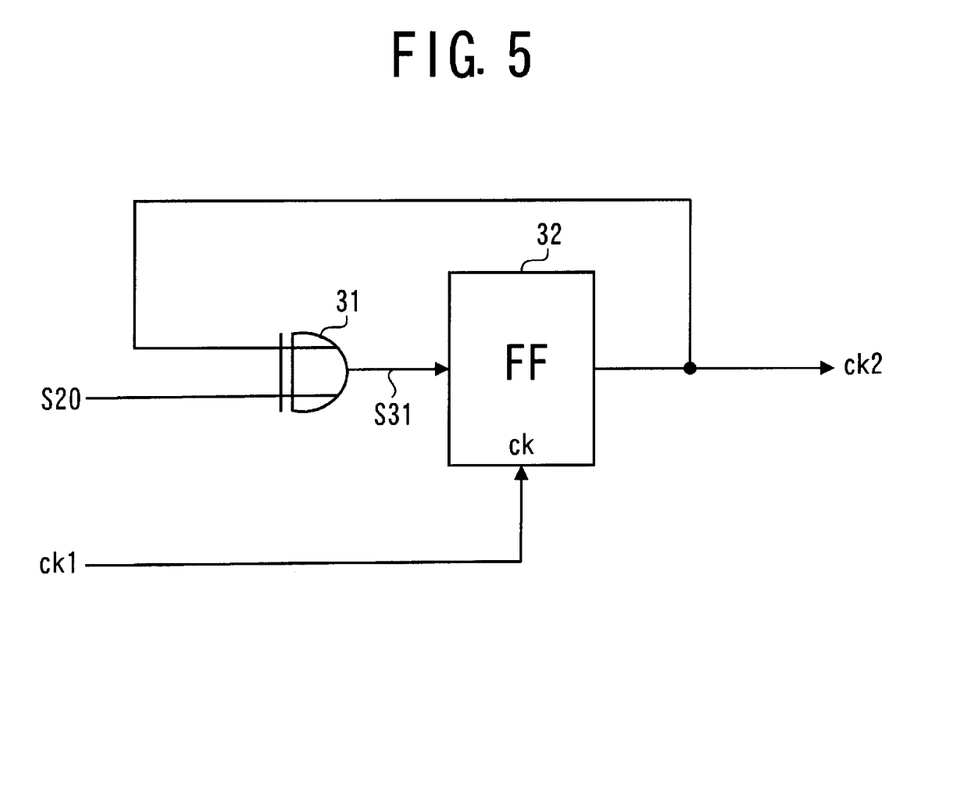
FIG. 5 is a circuit diagram showing a clock generator used in the clock generating circuit shown in FIG. 2.

FIG. 5 shows the clock generator 30 used in the clock generating circuit shown in FIG. 2. The clock generator 30 includes a logic circuit 31, for example, Exclusive OR circuit) and a flip-flop 32. The EOR 31 is supplied at the input terminals with the timing signal S20 and the second clock ck2, and is connected at the output terminal to the flip-flop 32. The flip-flop 32 is supplied at an input terminal with a signal S31 from the EOR. The signal S31 is supplied to the flip-flop 32 in synchronization with the first clock ck1 and the second clock ck2 is outputted therefrom.

Figure 6:
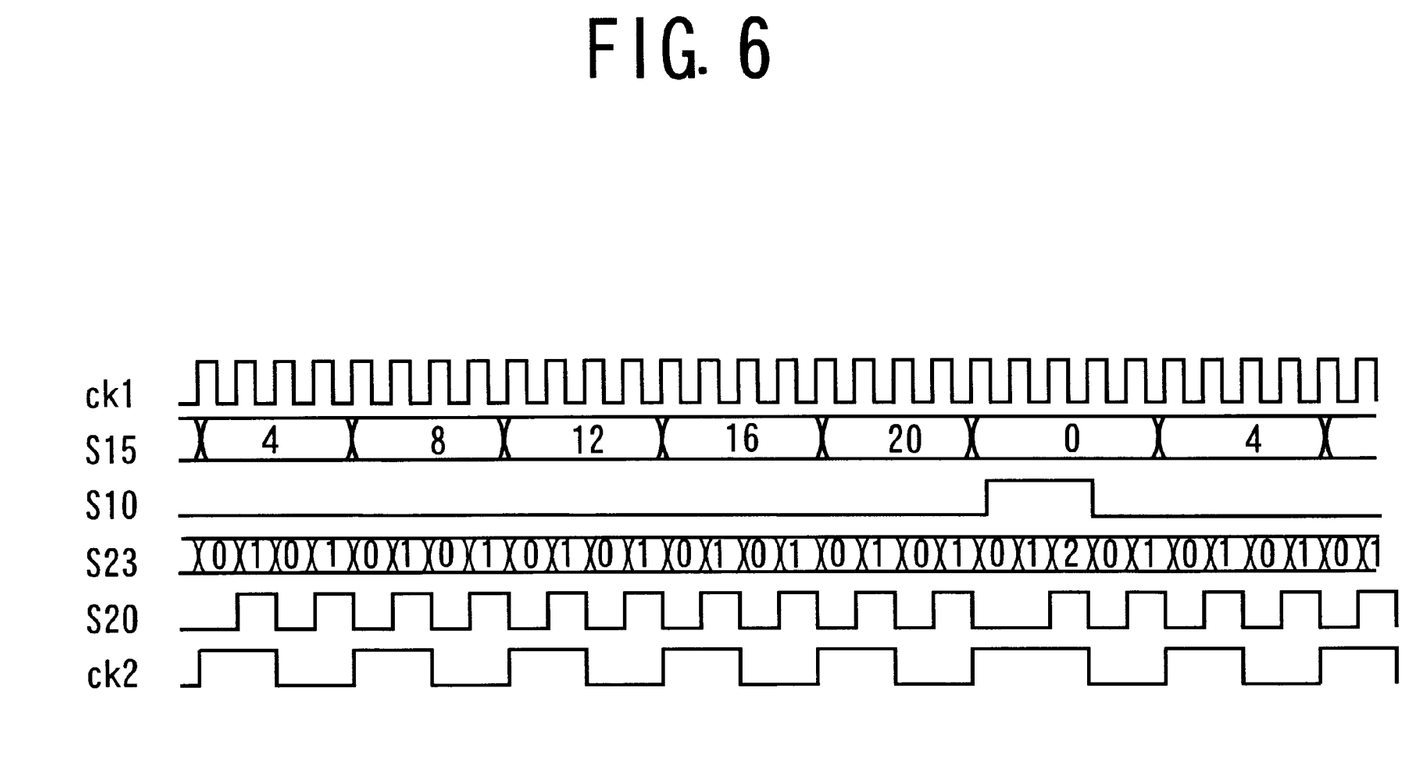
FIG. 6 is a time chart showing the operation of the first preferred embodiment.

Next, the operation of the clock generating circuit, shown in FIG. 2, will be described in conjunction with the time chart shown in FIG. 6. In this embodiment, the first and second clocks ck1 and ck2 are set to 100 Hz and 24 Hz, respectively. The first clock ck1 is not a multiple of the second clock ck2, therefore if the timing signal S20 is generated every two of the first clock ck1, 25 Hz of second clock ck2 would be generated.

In this embodiment, the difference accumulation unit 10 accumulates the phase difference between desirable clock (ck2) and actually generated clock (ck2) for every cycle. And, when the accumulated value reaches the cycle of the first clock ck1, the time-interval extension signal S10 is supplied to the time-interval generator 20. The time-interval generator 20 generates the timing signal S20 with an interval that is one cycle longer than the usual. When such an extended timing signal S20 is generated, the time-interval extension signal S10 becomes invalid, and the third selector 22, shown in FIG. 4, selects the parameter P3.

The difference of cycle between 24 Hz and 25 Hz is 1/24×25. The difference is accumulated, and the accumulated value reaches the cycle "1/100" of the first clock ck1 every six clocks by 25 Hz. In accordance with such timing, the difference accumulating unit 10 supplies the time-interval extension signal S10 to the time-interval generator 20. The time-interval generator 20 supplies the timing signal S20 to the clock generator 30. The clock generator 30 generates the second clock ck2 in synchronization with the timing signal S20, so that 24 Hz of clock ck2 synchronizing with the first clock ck1 is generated.

Next, the operation will be described for each of the difference accumulating unit 10, the time-interval generator 20 and the clock generator 30. The first to third parameters P1, P2 and P3 are set to as follows:

P1=24(Desirable Frequency of Clock ck2)

P2=4=100% 24(Frequency of ck1 % Frequency of ck2)

P3=1=100/(24×2)−1(Frequency of ck1/(Frequency of ck2×2)−1)

In the above shown equations, "%" indicates the remainder of a division operation in which the frequency of ck1 is divided by the frequency of ck2.

In the difference accumulating unit 10, the adder 11 combines the second parameter P2 (4) and the accumulated value (S15). In the initial state, the accumulator 15 is cleared, and the accumulated value S15 is zero, so that the signal S11 from the adder 11 is "4". The first comparator 12 compares the value "4" with the first parameter P1(24). As the first parameter P1 is larger than the value "4", the time-interval extension signal S10 is in the active mode, so that the first selector 13 selects the fixed parameter "0". The subtractor 14 subtracts the signal S13 from the signal S11. In this case, the subtractor 14 outputs a value "4" as the signal S14.

The register 16 stores the signal S12, supplied from the comparator 12, in synchronization with a rising edge of the clock ck2. In this application "rising edge" means a point where the logic level of the clock pulse changes low to high, while "falling edge" means a point where the logic level of the clock pulse changes high to low. The accumulator 15 accumulates the signal S14, supplied from the subtractor 14. Repeating such a step, the accumulator 15 outputs the signal S15 of "4", "8", "12", "16" . . . , successively.

When the signal S15 becomes "20", the output signal S11 of the adder 11 becomes "24". As the first parameter P1 ("24") is not larger than the signal S11, the signal S12 is in the active mode. In this case, the first selector 13 selects the first parameter P1, and the subtractor 14 outputs the signal S14 of "0" (=24−24). The signals S12 and S14 are supplied to the register 16 and the accumulator 15, respectively, in synchronization with rising edges of the second clock ck2. The time-interval extension signal S10 becomes in the active mode every six pulses of the clock ck2.

In the time-interval generator 20, the selector 22 selects the third parameter P3 ("1") when the time-interval extension signal S10 is in the non-active mode. The second comparator 24 compares the third parameter P3, supplied from the third selector 22, with the signal S23 (counted value), supplied from the counter 23. When those signals S22 and S23 are identical to each other, the third comparator 22 supplies the timing signal S20 to the clock generator 30. The timing signal S20 instructs logical-inverse of the clock ck2. As the third parameter P3 ("3") is compared with the signal S23, the counter 23 counts upward until the signal S23 becomes "1". As the timing signal S20 further functions as a reset signal to the counter 23, the counter 23 is reset in the next timing.

On the other hand, when the time-interval extension signal S10 is in the active mode, the third selector 22 selects the signal S21 ("2"), supplied from the incrementor 21. In this case, value "2" is compared with the signal S23, so that the counter 23 counts upward until the signal S23 becomes "2". When the time-interval extension signal S10 is in the active mode, the timing signal S20 has a cycle that is one clock (ck1) longer than the normal. After that, the register 16 is reset in synchronization with the falling edge of the timing signal S20, and therefore, the time-interval extension signal S10 becomes in the non-active mode.

In the clock generator 30, the EOR circuit 31 supplies the signal S31, generated by inverting the logic of the clock ck2, in synchronization with the timing signal S20. The signal S31 is supplied to the flip-flop 32 in synchronization with the clock ck1, and is outputted as the clock ck2.

Figure 7:
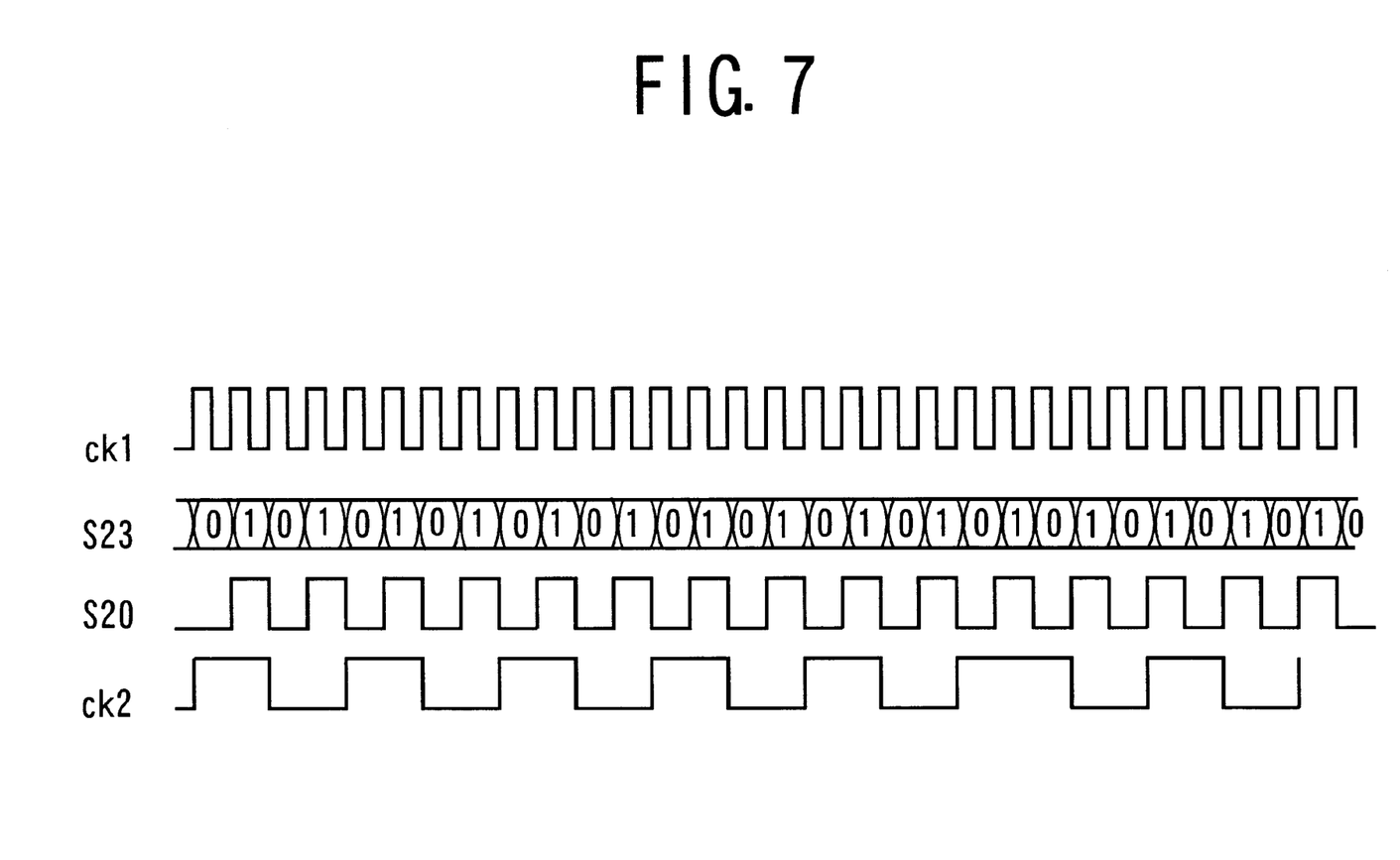
FIG. 7 is a time chart shows the operation of the first preferred embodiment.

FIG. 7 shows a time chart showing the operation of the clock generating circuit, shown in FIG. 2, in the case where the first clock ck1 and the second clock ck2 operate at frequencies of 100 Hz and 25 Hz, respectively.

As the frequency of the first clock ck1 is a multiple of the frequency of the second clock ck2, the difference accumulation unit 10 never supplies the time-interval extension signal S10. The time-interval generator 20 generates the timing signal S20 at rising edges of the first clock ck1 once every two edges.

As described above, according to the first preferred embodiment, the second clock ck2 can be precisely generated, in synchronization with the first clock ck1, to have a desirable frequency. In other words, there may be a large difference between the frequency of the second clock (output clock) ck2 and that of the first clock (input clock) ck1. The clock generating circuit can be designed in analog fashion, not digital, so that the circuitry can be designed simple and small. In addition, it is not necessary to adjust many components in the clock generating circuit, so that the clock ck2 is generated precisely.

Figure 8:
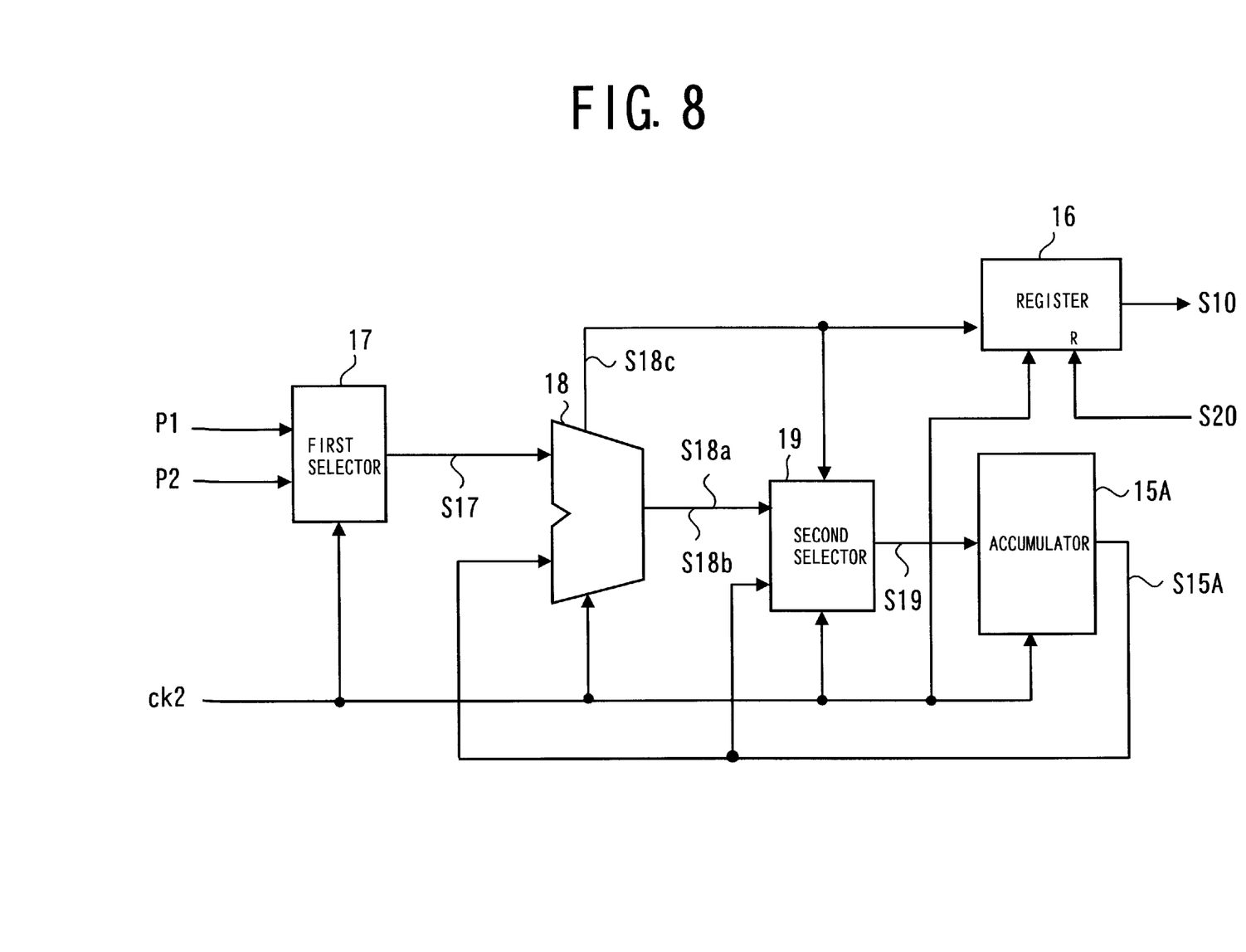
FIG. 8 is a circuit diagram showing an accumulation unit used in a clock generating circuit according to a second preferred embodiment of the present invention.

FIG. 8 shows a difference accumulation unit used in a clock generating circuit according to a second preferred embodiment of the invention. In this embodiment, the same or corresponding components are symbolized with the same reference symbols as those in the first preferred embodiment shown in FIG. 3.

The difference accumulation unit includes a register 16, a first selector 17, an arithmetic circuit 18, an accumulator 15A and a second selector 19. The first selector 17 is supplied at input terminals with the first and second parameters P1 and P2, and is connected at an output terminal to the arithmetic circuit 18. The first selector 17 selects either the first parameter P1 or the second parameter P2 in response to the second clock ck2. In more detail, the first selector 17 selects the second parameter P2 when the clock ck2 is at a high level (first logic level); and selects the first parameter P1 when the clock ck2 is at a low level (second logic level).

The arithmetic circuit 18 is supplied at input terminals with a signal S17 and a signal S15A. The arithmetic circuit 18 is connected at output terminals to the register 16 and the second selector 19. When the second clock ck2 is at high level "H", the arithmetic circuit 18 combines the signal S15A, supplied from the accumulator 15A, and the second parameter P2, supplied from the first selector 17, to generate a signal S18a.

When the clock ck2 is at low level "L", the arithmetic circuit 18 subtracts the first parameter P1, supplied from the first selector 17, from the signal S15A, supplied from the accumulator 15A, to generate a signal S18b. In such arithmetic process, if the first parameter P1 is identical to the signal S15A, the arithmetic circuit 18 supplies a carry signal S18c. When subtracting the parameter P1 from the signal S15A, the arithmetic circuit 18 actually produces the complement of the parameter P1 and adds it to the signal S15A.

The second selector 19 is supplied at input terminals with the second clock ck2, the signals S18a or S18b, and the signal S15A supplied from the accumulator 15A. The second selector 19 is connected at an output terminal to the accumulator 15A. When the clock ck2 is at high level "H", the second selector 19 selects the signal S18a. The second selector 19 selects the signal S15A when the clock ck2 is at low level "L". If the carry signal S18c is supplied from the arithmetic circuit 18, the second selector 19 selects the signal 18b.

The accumulator 15A is supplied at input terminals with the second clock ck2 and the signal S19, and is connected at an output terminal to the arithmetic circuit 18. In operation, the accumulator 15A receives and accumulates the output signals S19 of the second selector 19 in synchronization with the rising and falling edges of the second clock ck2 to generate the signal (accumulated value) S15A.

The register 16 is supplied at input terminals with the second clock ck2 and the carry signal S18c. The register 16 stores the carry signal S18c in synchronization with the rising edges of the clock ck2 and supplies the time-interval extension signal S10.

Now, the operation of the difference accumulation unit shown in FIG. 8, according to the second preferred embodiment, will be described.

(1) Clock ck2 is "H"

When the clock ck2 is at the high level "H", the first selector 17 selects the second parameter P2 ("4") and supplies it to the arithmetic circuit 18. The arithmetic circuit 18 operates as an adder to add the signal S17, corresponding to the second parameter P2, and the signal S15A. The second selector 19 selects the signal S18a, supplied from the arithmetic circuit 18, and supplies it to the accumulator 15A. The accumulator 15A receives the signal S18a in synchronization with the falling edges of the second clock ck2. In the initial state, the accumulator 15A is reset and the signal S15A indicates zero. Therefore, at the beginning, the arithmetic circuit 18 combines the second parameter P2 of "4" and zero, and a value "4" is supplied to the accumulator 15A. As a result, the signal (accumulated value) S15A becomes "4".

(2) Clock ck2 is "L"

When the clock ck2 is at the low level "L", the first selector 17 selects the first parameter P1 ("24") and supplies it to the arithmetic circuit 18. The arithmetic circuit 18 operates as a subtractor to subtract the signal S17, corresponding to the first parameter P1, from the signal S15A. In practice, as the signal S15A indicates "4", the arithmetic circuit 18 subtracts "24" from "4". In this case, the arithmetic circuit 18 does not generate the carry signal S18c, so that the second selector 19 selects the signal S15A ("4") and the value "4" is supplied to the accumulator 15A at the rising edge of the second clock ck2. The register 16 has the time-interval extension signal in the non-active mode.

When the above-described operations (1) and (2) are repeated alternately, the signal S15A increases to "4", "8", "12", "20" . . . When the signal S15A reaches a value "20", a value "24" is supplied to the accumulator 15A, and the arithmetic circuit 18 subtracts the first parameter P1 of "24" from the signal S15A of "24". As the first parameter P1 and the signal S15A are the same as each other, the arithmetic circuit 18 generates the carry signal 18c.

Then, the second selector 19 selects the signal S18b and supplies it as the signal S19 to the accumulator 15A. The accumulator 15A receives the signal S19 in synchronization with the rising edges of the second clock ck2. The carry signal S18c is supplied to the register 16 in synchronization with the rising edges of the second clock ck2, and therefore, the time-interval extension signal S10 gets into the active mode. The time-interval extension signal S10 is supplied to the timing generator 20.

According to the second preferred embodiment, the difference accumulation unit operates in time-divisional fashion in accordance with the logic level of the second clock ck2.

In FIG. 3, the adder 11 can be replaced by an incrementor that increments by "4". In FIG. 4, the incrementor may increment by of "2" or another value, and is not limited to "4" as in the embodiment.

What is claimed is:

1. A method for generating a clock, comprising the steps of:

providing a first clock operating at a first frequency;

providing a second clock operating at a second frequency that is different from the first frequency;

accumulating the phase difference between the second clock and a second parameter corresponding to a remainder of a division operation in which the first frequency is divided by the second frequency, in accordance with the second clock, a first parameter and the second parameter;

producing a time-interval extension signal when the accumulated value reaches a cycle of the first clock;

providing a third parameter that is generated by subtracting one from the quotient produced by dividing the first frequency by double of the second frequency;

producing a timing signal based on the third parameter when the time-interval extension signal is not supplied, while producing the timing signal based on a sum of the third parameter and the cycle of the first clock when the time-interval extension signal is supplied; and controlling the phase of the second clock in response to the timing signal.

2. A clock generating circuit that generates a second clock synchronizing with a first clock, in which the first clock operates at a first frequency and the second clock operates at a second frequency different than the first frequency, comprising:

an accumulating unit, which accumulates the phase difference between the second clock and a second parameter corresponding to a remainder of a division operation in which the first frequency is divided by the second frequency, in accordance with the second clock, a first parameter corresponding to the second frequency, and the second parameter; wherein a time-interval extension signal is generated when the accumulated value of the phase difference reaches a cycle of the first clock;

a timing signal generating circuit for producing a timing signal based on a third parameter when the time-interval extension signal is not supplied from the accumulating unit, and based on a sum of the third parameter and the cycle of the first clock when the time-interval extension signal is supplied from the accumulating unit, the third parameter being generated by subtracting one from the quotient produced by dividing the first frequency by double the second frequency; and a clock generator that outputs the second clock in synchronization with the first clock, in response to a signal generated by a logic of the second clock in synchronization with the timing signal.

3. The clock generating circuit according to claim 2, wherein the timing signal generating circuit comprises:

(1) an incrementor that increments the third parameter by a predetermined value;

(2) a third selector that selects the output signal of the incrementor when the time-interval extension signal is in an active mode, and selects the third parameter otherwise;

(3) a counter that counts the first clock to generate a count value, and resets in response to the timing signal; and (4) a second comparator that compares the count value, supplied from the counter, and the output signal of the third selector, and generates the timing signal when the compared values are identical to each other.

4. The clock generating circuit according to claim 2, wherein the clock generator comprises:

(1) a logic circuit that inverts the logic of the second clock in synchronization with the timing signal; and (2) a flip-flop that is supplied with the output signal of the logic circuit in synchronization with the first clock to generate the second clock.

5. The clock generating circuit according to claim 2, wherein the accumulation unit comprises:

(1) an adder that sums the accumulated value and the second parameter to generate a sum-signal;

(2) a first comparator that compares the sum-signal and the first parameter, supplies a non-active signal when the first parameter is larger than the sum-signal, and supplies an active signal otherwise;

(3) a first selector that is supplied with the first parameter a predetermined fixed value, and selects the fixed value when the non-active signal is supplied from the first comparator, and selects the first parameter when the active signal is supplied from the first comparator;

(4) a subtractor that subtracts the output signal of the selector from the sum-signal supplied from the adder;

(5) an accumulator that accumulates the output signal of the subtractor in synchronization with the second clock to generate the accumulated value; and (6) a register that temporarily stores the active signal in synchronization with the second clock and outputs the stored signal as the time-interval extension signal.

6. The clock generating circuit according to claim 5, wherein said fixed value is zero.

7. The clock generating circuit according to claim 5, wherein the timing signal generating circuit comprises:

(1) an incrementor that increments the third parameter by a predetermined value;

(2) a third selector that selects the output signal of the incrementor when the time-interval extension signal is in an active mode, and selects the third parameter otherwise;

(3) a counter that counts the first clock to generate a count value, and resets in response to the timing signal; and (4) a second comparator that compares the count value supplied from the counter, and the output signal of the third selector, and generates the timing signal when the compared values are identical to each other.

8. The clock generating circuit according to claim 5, wherein the clock generator comprises:

(1) a logic circuit that inverts the logic of the second clock in synchronization with the timing signal; and (2) a flip-flop that is supplied with the output signal of the logic circuit in synchronization with the first clock to generate the second clock.

9. The clock generating circuit according to claim 2, wherein the accumulation unit comprises:

(1) a first selector that selects the second parameter in a first logic state, and selects the first parameter in a second logic state;

(2) an arithmetic circuit that combines the accumulated value and the second parameter, supplied from the first selector when the second clock is at a first logic levels to generate a sum value; subtracts from the accumulated value the first parameter, supplied from the first selector when the second clock is at a second logic level to generate a subtraction value; and supplies a carry signal when the accumulated value is the same as the first parameter;

(3) a second selector that selects the sum value supplied from the arithmetic circuit, when the second clock is at the first logic level, selects the accumulated value when the second clock is at the second logic level, and selects the subtraction value, supplied from the arithmetic circuit, when the carry signal is supplied from the arithmetic circuit;

(4) an accumulator that accumulates the output signal of the second selector in synchronization with rising edges and falling edges of the second clock to generate the accumulated value; and (5) a register that temporarily stores the carry signal in synchronization with the rising edges of the second clock, and outputs the stored signal as the time-interval extension signal.

10. The clock generating circuit according to claim 9, wherein the timing signal generating circuit comprises:

(1) an incrementor that increments the third parameter by a predetermined value;

(2) a third selector that selects the output signal of the incrementor when the time-interval extension signal is in an active mode, and selects the third parameter otherwise;

(3) a counter that counts the first clock to generate a count value, and resets in response to the timing signal; and (4) a second comparator that compares the count value supplied from the counter, and the output signal of the third selector, and generates the timing signal when the compared values are identical to each other.

11. The clock generating circuit according to claim 9, wherein the clock generator comprises:

(1) a logic circuit that inverts the logic of the second clock in synchronization with the timing signal; and (2) a flip-flop that is supplied with the output signal of the logic circuit in synchronization with the first clock to generate the second clock.

* * * * *